(12) United States Patent
Hamada

(10) Patent No.: US 7,201,974 B2
(45) Date of Patent: Apr. 10, 2007

(54) ORGANIC ELECTROLUMINESCENCE ELEMENT

(75) Inventor: Yuji Hamada, Nara (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 0 days.

(21) Appl. No.: 09/984,605

(22) Filed: Oct. 30, 2001

(65) Prior Publication Data

US 2002/0081456 A1 Jun. 27, 2002

(30) Foreign Application Priority Data

Oct. 31, 2000 (JP) .............................. 2000-333757

(51) Int. Cl.
*H05B 33/12* (2006.01)
*H01L 27/32* (2006.01)
*H01L 51/50* (2006.01)

(52) U.S. Cl. ...................... 428/690; 428/917; 313/504; 313/506

(58) Field of Classification Search ................ 428/690, 428/917; 313/504, 506; 427/66
See application file for complete search history.

(56) References Cited

U.S. PATENT DOCUMENTS

| | | | |
|---|---|---|---|
| 5,085,947 A * | 2/1992 | Saito et al. | 428/690 |
| 5,811,834 A * | 9/1998 | Tamano et al. | 257/40 |
| 6,358,634 B1 | 3/2002 | Igarashi et al. | |
| 6,362,339 B1 * | 3/2002 | McCormick | 546/7 |
| 6,376,107 B1 * | 4/2002 | Heuer et al. | 428/690 |
| 6,458,475 B1 * | 10/2002 | Adachi et al. | 428/690 |
| 6,469,437 B1 * | 10/2002 | Parthasarathy et al. | 313/504 |

FOREIGN PATENT DOCUMENTS

| | | |
|---|---|---|
| EP | 0 969 532 | 1/2000 |
| JP | 04-357694 | * 12/1992 |
| JP | 05-182762 | * 9/1993 |
| JP | 7-150138 | 6/1995 |
| JP | 10-168443 | 6/1998 |
| JP | 10-219241 | 8/1998 |
| JP | 11-40355 | 2/1999 |
| JP | 2000-302754 | 10/2000 |
| WO | WO 00/33617 | 6/2000 |

OTHER PUBLICATIONS

Baldo, M.A. et al., "Very high-efficiency green organic light-emitting devices based on electrophosphorescence", Applied Physics Letters, vol. 75, No. 1, Jul. 5, 1999, pp. 4-6.*

(Continued)

*Primary Examiner*—Dawn L. Garrett
(74) *Attorney, Agent, or Firm*—Westerman, Hattori, Daniels & Adrian, LLP.

(57) ABSTRACT

An electron transport layer includes an electron transport material (host material) and a carrier transportable dopant. The carrier transportable dopant is contained 1% by weight to 50% by weight, preferably 1% by weight to 10% by weight for the electron transport material. A compound having a carbazole group or a derivative of the compound is employed as the carrier transportable dopant. A complex of an 8-hydroxyquinoline derivative and metal is employed as the electron transport material.

17 Claims, 1 Drawing Sheet

OTHER PUBLICATIONS

Choong, Vi-En et al., "Organic light-emitting diodes with a bipolar transport layer", Applied Physics Letters, vol. 75, No. 2, Jul. 12, 1999, pp. 172-174.*

Yasuhiko Shirota et al.; *Starburst molecules based on π-electron systems as materials for organic electroluminescent devices*; Journal of Luminescence 72-74 (1997), pp. 985-991.

M. A. Baldo et al.; *High-efficiency fluorescent organic light-emitting devices using a phosphorescent sensitizer*; Nature, vol. 403, Feb. 17, 2000, pp. 750-753.

Chihaya Adachi et al., *Organic Electroluminescent Device Having a Hole Conductor as an Emitting Layer*, Appl. Phys. Lett., vol. 55 (15) Oct. 9, 1989, pp. 1489-1491.

C.W. Tang et al., *Organic Electroluminescent Diodes*, Appl. Phys. Lett., vol. 51(12), Sep. 21, 1987, pp. 913-915.

S.A. Van Slyke et al., *Organic Electroluminescent Devices with Improved Stability*, Appl. Phys. Lett, vol. 69(15), Oct. 7, 1996, pp. 2160-2162.

Hany Aziz et al., *Degradation Mechanism of Small Molecule - Based Organic Ligh- Emitting Devices*, Science vol. 283, Mar. 19, 1999, pp. 1900-1902.

* cited by examiner

ORGANIC ELECTROLUMINESCENCE ELEMENT

BACKGROUND OF THE INVENTION

1. Field of the Invention

The present invention relates to an organic electroluminescence element.

2. Description of the Background Art

An organic electroluminescence element (hereinafter referred to as an organic EL element) is expected as a new self-light emission type element. The organic EL element has such a stacked structure that a carrier transport layer (an electron transport layer or a hole transport layer) and a luminescent layer are formed between a hole injection electrode and an electron injection electrode.

An electrode material which has a large work function such as gold or ITO (indium-tin oxides) is employed for the hole injection electrode, while a material which has a small work function such as Mg (magnesium) or Li (lithium) is employed for the electron injection electrode.

Organic materials are employed for a hole transport layer, a luminescent layer and an electron transport layer. Materials which have the property of p-type semiconductors are used for the hole transport layer, while those which have the property of n-type semiconductors are used for the electron transport layer. The luminescent layer also has carrier transportability such as electron transportability or hole transportability and is composed of an organic material, which emits fluorescence or phosphorescence.

The hole injection electrode, the hole transport layer, the luminescent layer, the electron transport layer and the electron injection electrode are stacked in this order so as to form an organic EL element.

Such function layers as the hole transport layer, the electron transport layer and the luminescent layer are formed of a plurality of layers, or alternatively, some of those layers are deleted depending on the organic materials to be employed.

In such an element structure as shown by Chihaya Adachi et al. in *Appl. Phys. Lett.*, Vol. 55, pp. 1489–1491(1989), for example, there exists only two organic layers of a luminescent layer and an electron transport layer between a hole injection electrode and an electron injection electrode. This is because the luminescent layer also serves as a hole transport layer since the luminescent layer made of NSD as a luminescent material has excellent hole transportability.

In such an element structure as shown by C. W. Tang et al. in *Appl. Phys. Lett.*, Vol. 51, pp. 913–915(1987), the structure is formed of two organic layers of a hole transport layer and a luminescent layer. In this case, Tris(8-hydroxyquinolinato)aluminum (hereinafter referred to as Alq) of the luminescent layer serves to both emit light and transport electrons.

On the other hand, such an element structure as shown by S. A. Van Slyke et al. in *Appl. Phys. Lett.*, Vol. 69, pp. 2160–2162(1996) is formed of three organic layers of a hole injection layer, a hole transport layer and a luminescent layer. In this case, the hole injection layer is composed of copper phthalocyanine and serves the same as the hole transport layer. That is, there exists two hole transport layers in the whole element.

Thus, free adjustments can be made in the number of layers constituted by the electron transport layer, hole transport layer and luminescent layer in dependence on the organic materials to be employed.

While the organic EL element is formed of the respective function layers of the electron transport layer, hole transport layer and luminescent layer, the organic materials now in use have insufficient transportability of electrons or holes. This provides such problems as low luminance or low luminous efficiency.

In particular, the electron transport layer has become the cause of such problems. As a material which has been widely used, Alq as described above is employed as an electron transport material. This organic material can also be employed as a luminescent material and can easily form films by vacuum vapor deposition. Further, this material has such excellent characteristics as high stability after film formation and high heat resistivity. However, the material provides poor carrier transportability of holes and electrons, exhibiting poor luminescent characteristics.

The disadvantage of Alq is that Alq deteriorates while being energized. (Refer to Hany Aziz et al., *Science*, Vol. 283, pp. 1900–1902(1999).) This results from deterioration of a molecule itself, which occurs if holes flow into Alq.

In *Appl. Phys. Lett.*, Vol. 75, pp. 172–174(1999), Vi-En Choong et al. have proposed employing N,N'-Di(naphthalen-1-yl)-N,N'-diphenyl-benzidine (hereinafter referred to as NPB), which is a hole transportable material, for Alq in order to solve the above disadvantage of Alq; however, such an approach has not yet overcome the above described low luminous efficiency.

SUMMARY OF THE INVENTION

An object of the present invention is to provide an organic electroluminescence element capable of obtaining high luminance and high luminous efficiency.

According to an aspect of the present invention, an organic electroluminescence element comprises a hole injection electrode, an electron transport layer, a luminescent layer and an electron injection electrode in this order, wherein at least one layer out of the electron transport layer and the luminescent layer includes a host material and a carrier transportable dopant, and the carrier transportable dopant is composed of a compound having a carbazole group or a derivative of the compound.

The compound having the carbazole group and its derivative are liable to be crystallized. Thus, if the electron transport layer or the luminescent layer is formed with single employment of the compound having the carbazole group or its derivative, or if such a compound or its derivative is employed for the electron transport layer or the luminescent layer as a host material of a doping method, it results in very lower durability and lower luminous efficiency.

In the organic electroluminescence element according to the present invention, the electron transport layer or the luminescent layer includes the carrier transportable dopant composed of the compound having the carbazole group or the derivative thereof, thereby attaining high luminance and high luminous efficiency.

The carrier transportable dopant may have such a molecular structure as expressed in the following chemical formula (1). In the formula (1), R1 may be a substituent, and R2 may be a bonding site or a substituent.

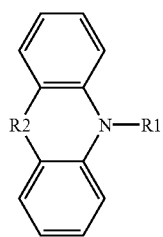

(1)

The carrier transportable dopant may be 4,4'-Bis(carbazol-9-yl)-biphenyl (hereinafter referred to as CBP). In this case, higher luminance and higher luminous efficiency are attained.

The carrier transportable dopant may be 4,4',4''-Tris(carbazol-9-yl)-triphenylamine (hereinafter referred to as TCTA). In this case, higher luminance and higher luminous efficiency are obtained.

The carrier transportable dopant is a compound expressed in the following chemical formula (2) where n may be integers of one or more. In this case, higher luminance and higher luminous efficiency are attained.

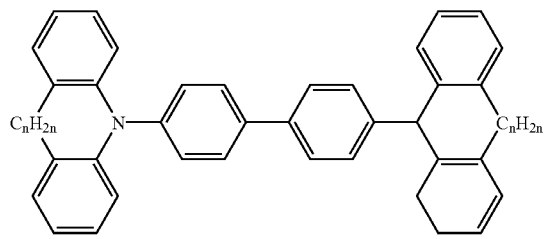

(2)

The carrier transportable dopant may be a compound having such a molecular structure as expressed in the following chemical formula (3) where R3 is hydrogen, alkyl group, phenyl group or naphthyl group. In this case, higher luminance and higher luminous efficiency are effected.

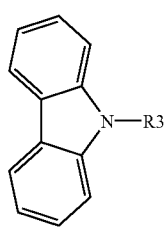

(3)

The carrier transportable dopant may be 9-phenylcarbazol. In this case, higher luminance and higher luminous efficiency are attained.

It is preferable that the content of the carrier transportable dopant in at least one layer out of the electron transport layer and the luminescent layer is 50% by weight or less for a host material. If the carrier transportable dopant is more than 50% by weight, it acts as the host material rather than the dopant, thereby facilitating crystallization. Further, it is preferable that the content of the carrier transportable dopant is 1% by weight or more for the host material. This leads to enhancement in luminescent characteristics and carrier transportability.

The host material may include a complex of an 8-hydroxyquinoline derivative and metal. This effects high luminance and high luminous efficiency.

The metal in the complex may be aluminum, zinc, magnesium or beryllium. It is particularly preferable that the metal in the complex is aluminum or zinc, thereby attaining high luminance and high luminous efficiency.

The 8-hydroxyquinoline derivative in the complex may be Tris(8-hydroxyquinolinato)aluminum (hereinafter referred to as Alq).

The 8-hydroxyquinoline derivative in the complex may be Tris(4-methyl-8-hydroxyquinolinato)aluminum.

The 8-hydroxyquinoline derivative in the complex may be Bis(8-hydroxyquinolinato)zinc.

The 8-hydroxyquinoline derivative in the complex may be Tris(4-hydroxyphenanthridinato)aluminum.

The 8-hydroxyquinoline derivative may be Tris(2-methyl-8-hydroxyquinolinato)aluminum.

At least one layer out of the electron transport layer and the luminescent layer may include 50% by weight or more of the host material. Moreover, the content of the host material is preferably 99% by weight or less.

The electron transport layer may include the host material and the carrier transportable dopant. Also in this case, luminance and luminous efficiency become enhanced.

Further, the luminescent layer may include the host material and the carrier transportable dopant. Luminance and luminous efficiency improve also in this case. The luminescent layer may further include a luminescent dopant.

The luminescent layer may further include an energy movable dopant. This results in satisfactorily high luminance and high luminous efficiency.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
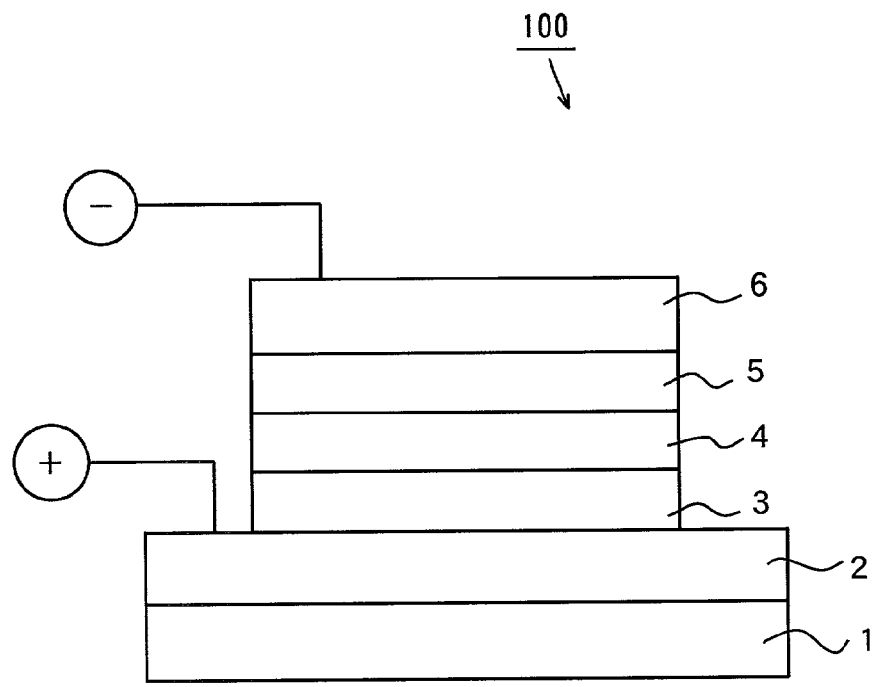
FIG. 1 is a model diagram showing one example of the structure of an organic EL element.

FIG. 1 is a model diagram showing one example of the structure of an organic electroluminescence element (hereinafter referred to as an organic EL element).

In an organic EL element 100 shown in FIG. 1, a hole injection electrode (anode) 2 made of a transparent conductive film is formed on a glass substrate 1. A hole transport layer 3 made of an organic material, a luminescent layer 4 made of an organic material and an electron transport layer 5 made of an organic material are formed in turn on the hole injection electrode 2. An electron injection electrode (cathode) 6 is formed on the electron transport layer 5.

In the organic EL element 100 shown in FIG. 1, the electron transport layer 5 includes an electron transport material (a host material) and a carrier transport able dopant. The carrier transportable dopant is contained 1% by weight to 50% by weight for the electron transport material, preferably 1% by weight to 10% by weight.

As the carrier transportable dopant, a compound having a carbazole group or a derivative of the compound is employed.

It is, in particular, preferable that the carrier transportable dopant has such a molecular structure as expressed in the above chemical formula (1).

Especially if R2 is a bonding site in the formula (1), the carbazole gruop is composed.

As the carrier transportable dopant, for example, it is possible to employ CBP having such a molecular structure as expressed in an chemical formula (4) below, TCTA having a molecular structure of a chemical formula (5) as shown below or the compound having the molecular structure of the above formula (2).

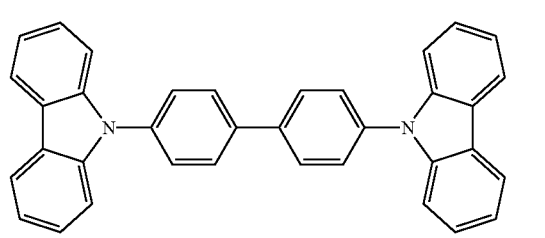

(4)

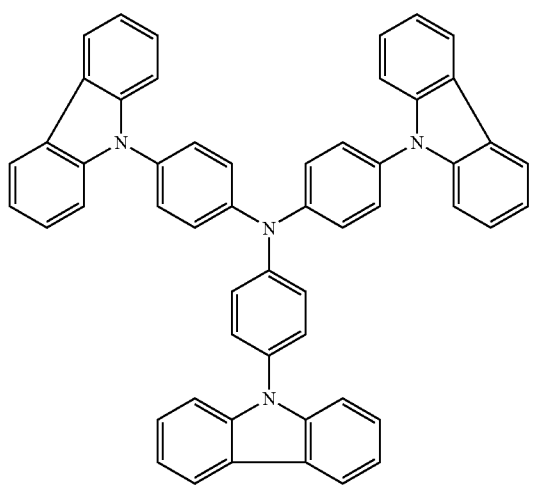

(5)

In the above chemical formula (2), it is preferable to satisfy n=1 to 5, and in the case where n=2 is satisfied, 4,4'-Bis(dihydro-dibenz-azepin-1-yl)-biphenyl (hereinafter referred to as AZB) is provided.

Alternatively, the compound having the molecular structure of the above chemical formula (3) may be employed as the carrier transportable dopant. In the formula (3), R3 is —$C_nH_{2n+1}$ (n=0 to 5), a phenyl group or a naphthyl group.

The compound having the molecular structure of the formula (3) may be, for example, 9-phenylcarbazol which has such a molecular structure as expressed in the following chemical formula (6).

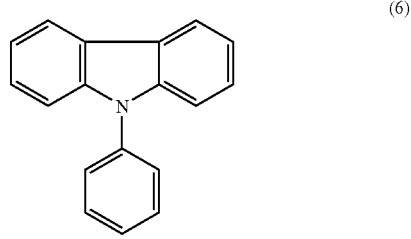

(6)

As the electron transport material, a complex of an 8-hydoxyquinoline derivative and metal is employed. The metal in the complex is aluminum, zinc, magnesium or beryllium, and especially aluminum or zinc is preferred.

As the electron transport material, for example, it is possible to employ Alq having a molecular structure of a chemical formula (7) below, Tris(4-methyl-8-hydroxyquinolinato)aluminum having a molecular structure of a chemical formula (8) below, Bis(8-hydroxyquinolinato)zinc having a molecular structure of a chemical formula (9) below, Tris (4-hydroxyphenanthridinato)aluminum having a molecular structure of the following chemical formula (10), Tris(2-methyl-8-hydroxyquinolinato)aluminum having a molecular structure of the following chemical formula (11), etc.

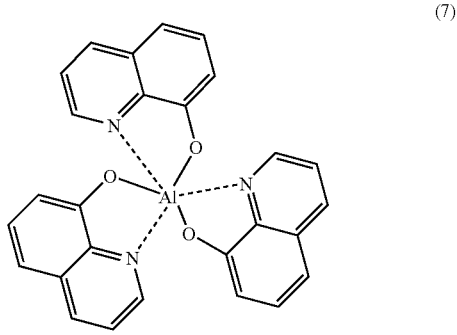

(7)

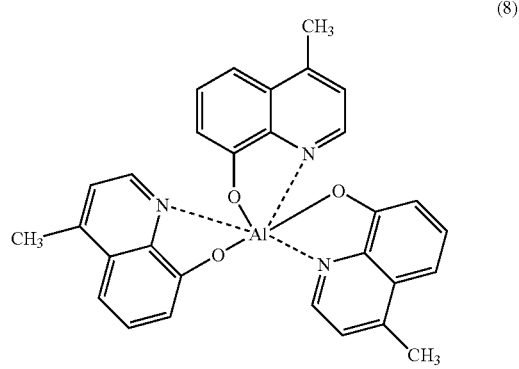

(8)

-continued

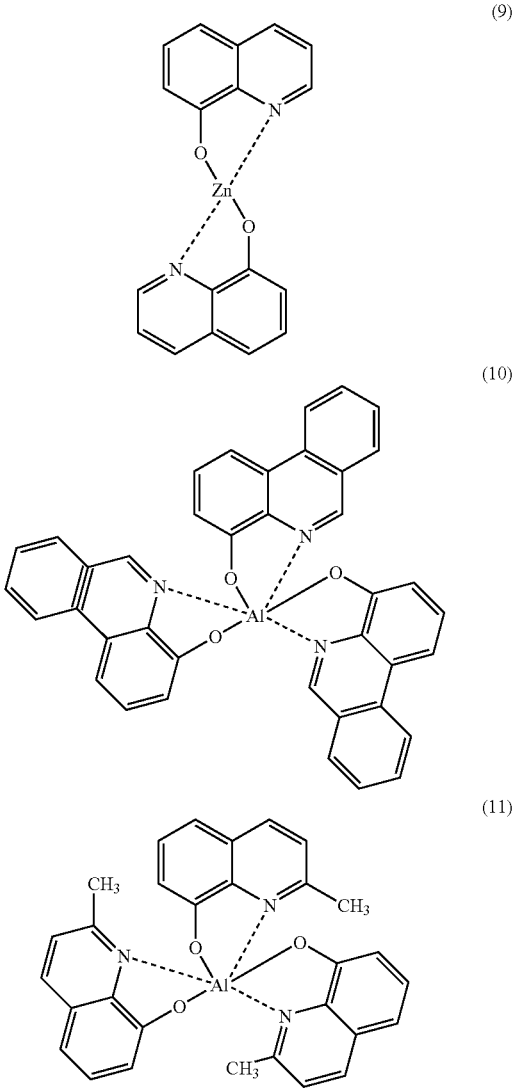

(9)

(10)

(11)

In the organic EL element 100 of FIG. 1, the electron transport layer 5 includes the carrier transportable dopant composed of the compound having the carbazole group or its derivative, thereby attaining high luminance and high luminous efficiency.

Figure 2:
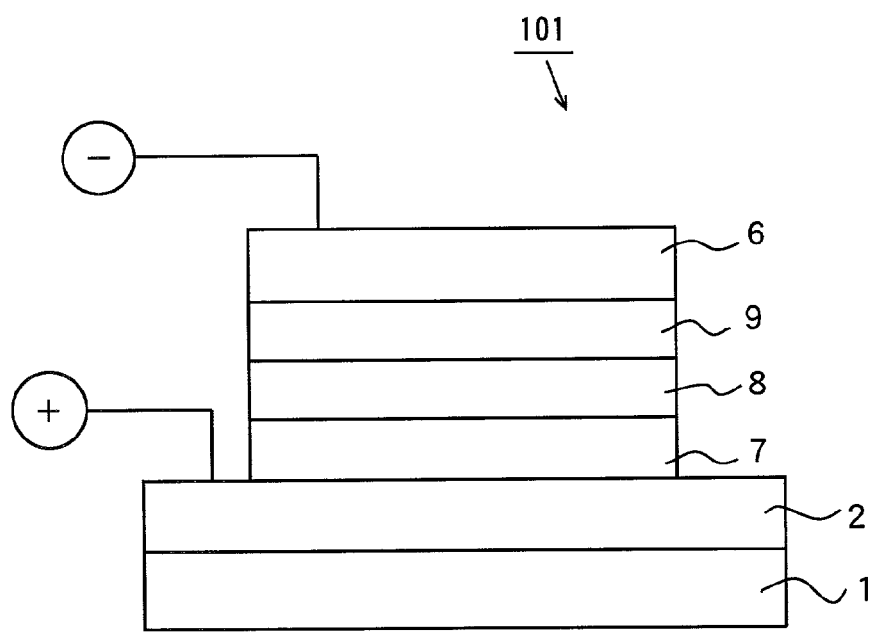
FIG. 2 is a model diagram showing another example of the structure of an organic EL element.

FIG. 2 is a model diagram showing another example of the structure of an organic electroluminescence element.

In an organic EL element 101, a hole injection electrode (anode) 2 made of a transparent conductive film is formed on a glass substrate 1. A first hole transport layer 7 made of an organic material, a second hole transport layer 8 made of an organic material and a luminescent layer 9 made of an organic material are formed in turn on the hole injection electrode 2. An electron injection electrode (cathode) 6 is formed on the luminescent layer 9.

In the organic EL element 101 shown in FIG. 2, the luminescent layer 9 includes a host material and a carrier transportable dopant. The carrier transportable dopant is contained 1% by weight to 50% by weight for the host material, preferably 1% by weight to 10% by weight.

As the carrier transportable dopant, a compound having a carbazole group or a derivative of the compound is employed.

In particular, it is preferable that the carrier transportable dopant has the molecular structure expressed in the above chemical formula (1). Especially, if R2 in the formula (1) is a bonding site, a carbazole group is composed.

As the carrier transportable dopant, for example, it is possible to employ CBP having the molecular structure of the above chemical formula (4), TCTA having the molecular structure of the above formula (5), or the compound having the molecular structure of the above formula (2).

In the above formula (2), it is preferable to satisfy n=1 to 5. In the case where n=2 is satisfied, 4,4'-Bis(dihydro-dibenz-azepin-1-yl)-biphenyl (hereinafter referred to as AZB) is provided.

Alternatively, the compound having the molecular structure of the above formula (3) may be used as the carrier transportable dopant. R3 in the formula (3) is —$C_nH_{2n+1}$ (n=0 to 5), a phenyl group or a naphthyl group.

The compound having the molecular structure of the formula (3) may be, for example, 9-phenylcarbazol having the molecular structure of the above formula (6).

A complex of an 8-hydroxyquinoline derivative and metal is employed as a host material. The metal contained in the complex is aluminum, zinc, magnesium or beryllium. Especially, aluminum or zinc is preferred.

As the host material, for example, it is possible to employ Alq having the molecular structure of the above chemical formula (7), Tris(4-methyl-8-hydroxyquinolinato)aluminum having the molecular structure of the above formula (8), Bis(8-hydroxyquinolinato)zinc having the molecular structure of the above formula (9), Tris(4-hydroxyphenanthridinato)aluminum having the molecular structure of the above formula (10), Tris(2-methyl-8-hydroxyquinolinato)aluminum having the molecular structure of the above formula (11), etc.

The luminescent layer 9 may further be doped with a luminescent dopant. As the luminescent dopant, it is possible to employ, for example, Rubrene having a molecular structure expressed in a chemical formula (12) below or 2-(1,1-Dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene)propanedinitrile (hereinafter referred to as DCJTB) having a molecular structure expressed in the following chemical formula (13).

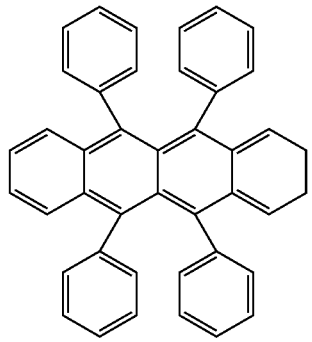

(12)

-continued

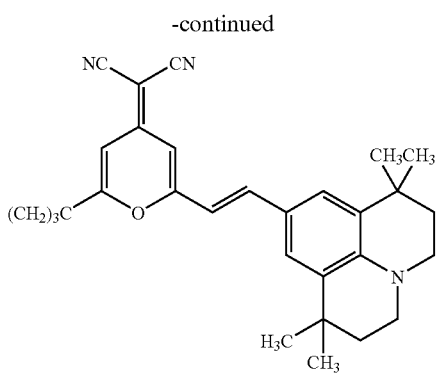
(13)

The luminescent layer 9 may further be doped with an energy movable dopant. This leads to satisfactorily high luminance and high luminous efficiency. As the energy movable dopant, Rubrene, for example, can be employed.

The luminescent layer 9 may contain 50% by weight or more of the host material. Moreover, the content of the host material is preferably 99% by weight or less.

In the organic EL element 101 of FIG. 2, the luminescent layer 9 includes the carrier transportable dopant composed of the compound having the carbazole group or its derivative, thereby attaining high luminance and high luminous efficiency.

The structure of the organic EL element is not limited to the above described structures but can employ various structures. For example, three layers of the hole injection layer, the hole transport layer and the luminescent layer may be provided between the hole injection electrode 2 and the electron injection electrode 6. Only two layers of the luminescent layer and the electron transport layer may be provided between the hole injection electrode 2 and the electron injection electrode 6.

Application of voltage between the hole injection electrode 2 and the electron injection electrode 6 causes the luminescent layer 5 of the organic EL element 100, 101 to become luminous and then allows light to be emitted from the reverse face of the glass substrate 1.

EXAMPLES

Organic EL elements in inventive examples 1 to 12 and those in comparative examples 1 to 6 were manufactured to measure luminescent characteristics as will now be described.

(Cases Where Carrier Transportable Dopants Were Employed for an Electron Transport Layer)

In inventive examples 1 to 7 and comparative examples 1 to 3, examinations were made on effects in luminescent characteristics when carrier transportable dopants were employed for an electron transport layer.

Inventive Example 1

An organic El element in the inventive example 1 has such a structure as shown in FIG. 1. A hole injection electrode (anode) 2 is composed of indium-tin oxides (ITO). A hole transport layer 3 has a thickness of 500 Å and is composed of 2TNATA having a molecular structure of a chemical formula (14) shown below. A luminescent layer 4 having a thickness of 150 Å contains NPB having a molecular structure of a chemical formula (15) as a host material and also contains as a luminescent dopant 5% by weight of Rubrene for the host material. An electron transport layer 5 having a thickness of 350 Å contains Alq as an electron trasport material (host material) and also contains as a carrier transportable dopant 4% by weight of CBP for the electron transport material. An electron injection electrode (cathode) 6 is composed of a MgIn alloy (a ratio of 10 to 1) with a thickness of 2000 Å.

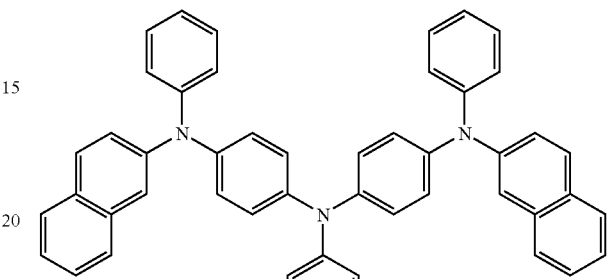
(14)

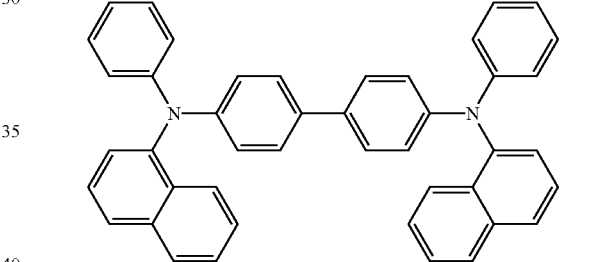
(15)

The organic EL element having the above described structure was manufactured by the following process. First, the hole injection electrode 2 composed of indium-tin oxides (ITO) was formed on a glass substrate 1. The glass substrate 1, on which the hole injection electrode 2 was formed, was then cleaned with a neutral detergent, and thereafter cleaned by ultrasonic cleaning in acetone for 10 minutes and in ethanol for 10 minutes. Further, the surface of the glass substrate 1 was cleaned in an ozone cleaner.

After cleaning, the hole transport layer 3, the luminescent layer 4, the electron transport layer 5 and the electron injection electrode 6 were stacked in turn on the hole injection electrode 2 made of the above ITO by vacuum vapor deposition. The vacuum vapor deposition of these layers and electrodes was made under conditions of ordinary temperature at the degree of vacuum $1\times10^{-6}$ Torr without control of substrate temperature.

The hole injection electrode 2 of this organic EL element was applied with a positive bias voltage, and the electron injection electrode 6 was applied with a negative voltage, so as to measure luminescent characteristics.

Inventive Example 2

An organic EL element in the inventive example 2 was manufactured under the same conditions as applied to the organic EL element in the inventive example 1 except that TCTA was substituted for CBP as the carrier transportable dopant to be employed for the electron transport layer 5.

Inventive Example 3

An organic EL element in the inventive example 3 was manufactured under the same conditions as applied to the organic EL element in the inventive example 1 except that AZB was substituted for CBP as the carrier transportable dopant to be employed for the electron transport layer 5.

Inventive Example 4

An organic EL element in the inventive example 4 was fabricated under the same conditions as applied to the organic EL element in the inventive example 1 except that Tris(4-methyl-8-hydroxyquinolinato)aluminum was substituted for Alq as the electron transport material (host material) to be employed for the electron transport layer 5.

Inventive Example 5

An organic EL element in the inventive example 5 was fabricated under the same conditions as applied to the organic EL element in the inventive example 1 except that Bis(8-hydroxyquinolinato)zinc was substituted for Alq as the electron transport material (host material) of the electron transport layer 5.

Inventive Example 6

An organic EL element in the inventive example 6 was manufactured under the same conditions as applied to the organic EL element in the inventive example 1 except that Tris(4-hydroxyphenanthridinato)aluminum was substituted for Alq as the electron transport material (host material) to be employed for the electron transport layer 5.

Inventive Example 7

An organic EL element in the inventive example 7 was fabricated under the same conditions as applied to the organic EL element in the inventive example 1 except that 9-phenylcarbazol was substituted for CBP as the carrier transportable dopant to be employed for the electron transport layer 5.

Comparative Example 1

An organic EL element in the comparative example 1 was manufactured under the same conditions as applied to the organic EL element in the inventive example 1 except that NPB was substituted for CBP as the carrier transportable dopant to be used for the electron transport layer 5.

Comparative Example 2

An organic EL element in the comparative example 2 was manufactured under the same conditions as applied to the organic EL element in the inventive example 1 except that MTDATA having a molecular structure of a chemical formula (16) as below was substituted for CBP as the carrier transportable dopant to be used for the electron transport layer 5.

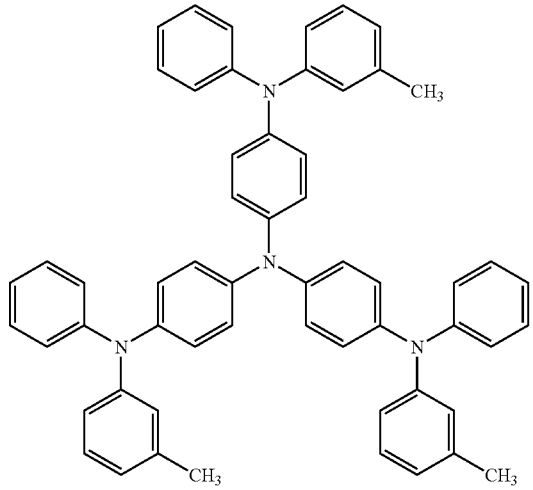

(16)

Comparative Example 3

An organic EL element in the comparative example 3 was fabricated under the same conditions as applied to the organic El element in the inventive example 1 except that no carrier transportable dopant was employed.

The materials of the electron transport layer in the organic EL elements of the above described inventive examples 1 to 7 and the comparative examples 1 to 3 are shown in Table 1.

TABLE 1

| | Electron Transportlayer | |
|---|---|---|
| | Electron Transport Material | Carrier Transportable Dopant |
| Inventive Example 1 | Alq | CBP |
| Inventive Example 2 | Alq | TCTA |
| Inventive Example 3 | Alq | AZB |
| Inventive Example 4 | Tris( 4-menthly-8-hydroxyquinolinato)aluminium | CBP |
| Inventive Example 5 | Bis(8-Hydroxyquinolinato) zinc | CBP |
| Inventive Example 6 | Tris(4-hydroxyphenanthridinato) aluminium | CBP |
| Inventive Example 7 | Alq | 9-phenylcarbozol |
| Comparative Example 1 | Alq | NPB |
| Comparative Example 2 | Alq | MTDATA |
| Comparative Example 3 | Alq | None |

Results of measurement in luminescent characteristics as to the organic EL elements of the inventive examples 1 to 7 and the comparative examples 1 to 3 are shown in Table 2.

TABLE 2

| Name of Elemnt | Efficiency (at 100 cd/m$^2$) | Luminescent Color |
| --- | --- | --- |
| Inventive Example 1 | 9.0 cd/A | Yellow |
| Inventive Example 2 | 8.2 cd/A | Yellow |
| Inventive Example 3 | 7.6 cd/A | Yellow |
| Inventive Example 4 | 9.5 cd/A | Yellow |
| Inventive Example 5 | 8.1 cd/A | Yellow |
| Inventive Example 6 | 7.9 cd/A | Yellow |
| Inventive Example 7 | 8.5 cd/A | Yellow |
| Comparative Example 1 | 7.4 cd/A | Yellow |
| Comparative Example 2 | 4.6 cd/A | Yellow |
| Comparative Example 3 | 6.6 cd/A | Yellow |

As shown in Table 2, the organic EL elements of the inventive examples 1 to 7 and those of the comparative examples 1 to 3 emitted yellow light.

Further, as can be understood from Table 2, the luminous efficiencies in the organic EL elements of the inventive examples 1, 4, 5 and 6 employing CBP as the carrier transportable dopant, the organic EL element of the inventive example 2 employing TCTA, that of the inventive example 3 employing AZB and that of the inventive example 7 employing 9-phenylcarbazol became higher than the luminous efficiencies in the organic EL element of the comparative example 1 employing NPB as the carrier transportable dopant, that of the comparative example 2 employing MTDATA and that of the comparative example 3 employing no carrier transportable dopant.

When Alq was employed as the electron transportable material, in particular, the luminous efficiencies in the respective cases where CBP was employed as the carrier transportable dopant, where 9-phenycarbazol was employed, where TCTA was employed and where AZB was employed became higher in this order.

Further, when CBP was employed as the carrier transportable dopant, high luminous efficiencies of 8 cd/A or more were achieved in any respective cases where Alq, Tris(4-methyl-8-hydroxyquinolinato)aluminum, Bis(8-hydroxyquinolinato)zinc or Tris(4-hydroxyphenanthridinato)aluminum was employed as the electron transport material.

It was apparent from the above results that the luminances and the luminous efficiencies became highly enhanced in any organic EL elements, in which the compounds having the carbazole gruop or their derivatives were employed as the carrier transportable dopant of the electron transport layer, as compared to those in which the other organic materials were employed as the carrier transportable dopant of the electron transport layer.

(Cases Where Carrier Transportable Dopants Were Employed for a Luminescent Layer)

Examinations were made on effects in luminescent characteristics in the cases where carrier transportable dopants were employed for the luminescent layer in inventive examples 8 to 12 and comparative examples 4 to 6.

Inventive Example 8

An organic EL element of the inventive example 8 has such a structure as shown in FIG. 2. A hole injection electrode (anode) 2 is composed of indium-tin oxides (ITO). A first hole transport layer 7 has a thickness of 500 Å and is composed of 2TNATA. A second hole transport layer 8 has a thickness of 150 Å and is composed of NPB. A luminescent layer 9 has a thickness of 350 Å and contains Alq as a host material (luminescent material) and 6% by weight of CBP as a carrier transportable dopant for the host material. An electron injection electrode (cathode) 6 is composed of a MgIn alloy (a ratio of 10 to 1) having a thickness of 2000 Å.

Conditions under which the organic EL element of the inventive example 8 was manufactured were the same as those applied to the organic EL element of the inventive example 1.

The hole injection electrode 2 of this organic EL element was applied with a positive bias voltage, and the electron injection electrode 6 was applied with a negative bias voltage, so as to measure luminescent characteristics.

Comparative Example 4

An organic EL element of the comparative example 4 was manufactured under the same conditions as applied to the organic EL element of the inventive example 8 except that no carrier transportable dopant was employed for the luminescent layer 9.

Inventive Example 9

An organic EL element of the inventive example 9 was fabricated under the same conditions as applied to the organic EL element of the inventive example 8 except that Rubrene as a luminescent dopant was doped 5% by weight for Alq into the luminescent layer 9.

Comparative Example 5

An organic EL element of the comparative example 5 was manufactured under the same conditions as applied to the organic EL element of the inventive example 9 except that no carrier transportable dopant was employed for the luminescent layer 9.

Inventive Example 10

An organic EL element of the inventive example 10 was fabricated under the same conditions as applied to the organic EL element of the inventive example 9 except that the luminescent layer 9 was doped with 2% by weight, for Alq, of DCJTB being a red luminescent dopant to be employed as a luminescent dopant.

That is to say, the luminescent layer 9 contains Alq as the host material, DCJTB as the red luminescent dopant, Rubrene as the energy movable dopant and CBP as the carrier transportable dopant.

Since the wavelength of fluorescence of Rubrene is 566 nm which is shorter than the wavelength of fluorescence of DCJTB being 649 nm, energy moves from Rubrene having large excitation energy to DCJTB having small excitation energy. Thus, Rubrene does not emit light, but DCJTB emits red light in this luminescent layer 9.

Inventive Example 11

An organic EL element of the inventive example 11 was manufactured under the same conditions as applied to the organic EL element of the inventive example 10 except that the luminescent layer 9 was doped with 6% by weight of TCTA for Alq in place of CBP as the carrier transportable dopant.

Comparative Example 6

An organic EL element of the comparative example 6 was manufactured under the same conditions as applied to the organic EL element of the inventive example 10 except that no carrier transportable dopant was employed for the luminescent layer 9.

Inventive Example 12

An organic EL element of the inventive example 12 was fabricated under the same conditions as applied to the organic EL element of the inventive example 10 except that Tris(2-methyl-8-hydroxyquinolinato)aluminum was employed in place of Alq as the host material for the luminescent layer 9.

Table 3 shows the materials of the electron transport layer in the respective organic EL elements of the above described inventive examples 8 to 12 and comparative examples 4 to 6.

TABLE 3

| | Luminescent Layer | | | |
|---|---|---|---|---|
| | Host Material | Luminescent Dopant | Energy Movable Dopant | Carrier Transportable Dopant |
| Inventive Example 8 | Alq | | | CBP |
| Comparative Example 4 | Alq | | | None |
| Inventive Example 9 | Alq | Rubrene | | CBP |
| Comparative Example 5 | Alq | Rubrene | | None |
| Inventive Example 10 | Alq | DCJTB | Rubrene | CBP |
| Inventive Example 11 | Alq | DCJTB | Rubrene | TCTA |
| Comparative Example 6 | Alq | DCJTB | Rubrene | None |
| Inventive Example 12 | Tris(2-menthyl-8-hydroxyquinolinato) aluminium | DCJTB | Rubrene | CBP |

Table 4 shows the results of luminescent characteristics as to the respective organic EL elements of the inventive examples 8 to 12 and comparative examples 4 to 6.

TABLE 4

| Name of Elemnt | Efficiency (at 100 cd/m$^2$) | Luminescent Color |
|---|---|---|
| Inventive Example 8 | 5.0 cd/A | Green |
| Comparative Example 4 | 3.6 cd/A | Green |
| Inventive Example 9 | 7.3 cd/A | Yellow |
| Comparative Example 5 | 5.4 cd/A | Yellow |
| Inventive Example 10 | 2.1 cd/A | Red |
| Inventive Example 11 | 2.0 cd/A | Red |
| Comparative Example 6 | 1.5 cd/A | Red |
| Inventive Example 12 | 1.9 cd/A | Red |

As shown in Table 4, the organic EL element of the inventive example 8 and that of the comparative example 4 both emitted green light. It is understood from the comparison between the inventive example 8 and the comparative example 4 that luminous efficiency becomes enhanced by employment of CBP as the carrier transportable dopant for the luminescent layer 9.

In addition, the organic EL element of the inventive example 9 and that of the comparative example 5 emitted yellow light. It is understood from the comparison between the inventive example 9 and the comparative example 5 that luminous efficiency becomes higher by employment of CBP as the carrier transportable dopant for the luminescent layer 9.

Moreover, the respective organic EL elements of the inventive examples 10, 11 and 12 and the comparative example 6 emitted red light. It is understood from the comparison among the inventive examples 10, 11 and the comparative example 6 that luminous efficiency becomes enhanced by employment of CBP or TCTA as the carrier transportable dopant for the luminescent layer 9.

It is also understood from the inventive example 12 that luminous efficiency becomes higher by employment of Tris(2-methyl-8-hydroxyquinolinato)aluminum in place of Alq as the host material for the luminescent layer 9.

It is apparent from the above results that the luminance and the luminous efficiency become highly enhanced in the organic EL elements employing the compounds having the carbazole group as the carrier transportable dopants as compared with those employing other organic materials as the carrier transportable dopants of the electron transport layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An organic electroluminescence element, comprising:
   a hole injection electrode;
   a luminescent layer;
   an electron transport layer;
   an electron injection electrode in this order, wherein said electron transport layer includes a host material and a carrier transportable dopant, said carrier transportable dopant is composed of a compound having a carbazole group or a derivative of said compound, and the content of said carrier transportable dopant in said electron transport layer is from 1 to 50% by weight for said host material.

2. The organic electroluminescence element according to claim 1, wherein said carrier transportable dopant has a molecular structure expressed in a chemical formula (1) shown below where R1 is a substituent and R2 is a bonding site or a substituent.

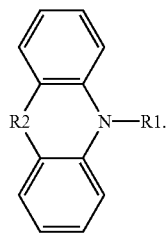

(1)

3. The organic electroluminescence element according to claim 1, wherein said carrier transportable dopant is 4,4'-Bis(carbazol-9-yl)-biphenyl.

4. The organic electroluminescence element according to claim 1, wherein said carrier transportable dopant is 4,4',4''-Tris (carbazol-9-yl)-triphenylamine.

5. The organic electroluminescence element according to claim 1, wherein said carrier transportable dopant is a compound expressed in a chemical formula (2) shown below where n is an integer of 1 or more.

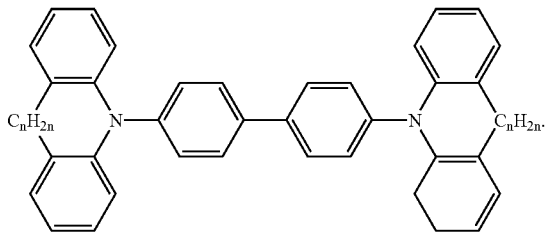

(2)

6. The organic electroluminescence element according to claim 1, wherein said carrier transportable dopant is a compound having a molecular structure expressed in a chemical formula (3) as shown below where R3 is hydrogen, alkyl group, phenyl group or naphthyl group

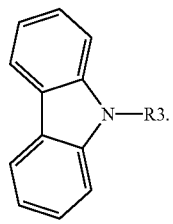

(3)

7. The organic electroluminescence element according to claim 6, wherein said carrier transportable dopant is 9-phenylcarbazol.

8. The organic electroluminescence element according to claim 1, wherein said host material includes a complex of an 8-hydroxyquinoline derivative and metal.

9. The organic electroluminescence element according to claim 8, wherein said metal in said complex is aluminum, zinc, magnesium or beryllium.

10. The organic electroluminescence element according to claim 9, wherein said 8-hydroxyquinoline derivative in said complex is Tris (8-hydroxyquinolinato) aluminum.

11. The organic electroluminescence element according to claim 8, wherein said 8-hydroxyquinoline derivative in said complex is Tris (4-methyl-8-hydroxyquinolinato) aluminum.

12. The organic electroluminescence element according to claim 8, wherein said 8-hydroxyquinoline derivative in said complex is Bis(8-hydroxyquinolinato)zinc.

13. The organic electroluminescence element according to claim 8, wherein said 8-hydroxyquinoline derivative in said complex is Tris(4-hydroxyphenanthridinato) aluminum.

14. The organic electroluminescence element according to claim 8, wherein said 8-hydroxyquinoline derivative in said complex is Tris (2-methyl-8-hydroxyquinolinato) aluminum.

15. The organic electroluminescence element according to claim 1, wherein said electron transport layer includes 50% by weight or more of said host material.

16. The organic electroluminescence element according to claim 1, wherein said luminescent layer further includes a luminescent dopant.

17. The organic electroluminescence element according to claim 1, wherein said luminescent layer further includes an energy movable dopant.

* * * * *